United States Patent [19]

Wynn

[11] Patent Number: 4,496,912

[45] Date of Patent: Jan. 29, 1985

[54] PHASE LOCKED LOOP WITH OSCILLATOR BLOCKING FOR IMPROVED ACQUISITION TIME

[75] Inventor: Stephen R. Wynn, Lynchburg, Va.

[73] Assignee: General Electric Company, Lynchburg, Va.

[21] Appl. No.: 386,932

[22] Filed: Jun. 10, 1982

[51] Int. Cl.³ .............................................. H03L 7/06
[52] U.S. Cl. .................................... 331/1 A; 331/14; 331/16; 331/25
[58] Field of Search ..................... 331/1 A, 14, 16, 25, 331/27

[56] References Cited

U.S. PATENT DOCUMENTS

2,968,769  1/1961  Johnson et al. ...................... 331/14
4,392,113  7/1983  Jackson ................................ 331/14

Primary Examiner—Eugene R. Laroche
Assistant Examiner—Robert J. Pascal
Attorney, Agent, or Firm—James J. Williams; Robert C. Lampe, Jr.

[57] ABSTRACT

Rapid lock or synchronization between a reference oscillator and a voltage controlled oscillator in a phase locked loop circuit is achieved by a synchronizing circuit. The synchronizing circuit senses the magnitude of the ramp signal produced by the phase locked loop circuit, and produces a blocking signal when the ramp signal exceeds a predetermined level. This blocking signal is applied to one of the oscillators to block that one oscillator pulse during the blocking signal, thus moving the two oscillator signals closer together more quickly, and thus providing lock or synchronization more rapidly.

25 Claims, 9 Drawing Figures

PHASE LOCKED LOOP WITH OSCILLATOR BLOCKING FOR IMPROVED ACQUISITION TIME

BACKGROUND OF THE INVENTION

My invention relates to a phase locked loop circuit, and particularly to a phase locked loop circuit that synchronizes a voltage controlled oscillator with a reference oscillator relatively quickly.

Voltage controlled and reference oscillators are used with phase locked loop circuits for various applications, such as a frequency synthesizer for radio and electronic equipment. In such equipment, particularly multichannel radio equipment, it is desirable or necessary that the frequency or channel of the radio be changed by programming information. Such programming information may and frequently does cause prior art phase locked loops to lose synchronization, with the result that a voltage controlled oscillator may wander over a wide frequency range for a long time before synchronization is restored.

Prior art phase locked loops use a phase detector that samples a ramp voltage produced by a ramp generator and started by each pulse from the reference oscillator. This sample is taken in response to each pulse produced by the voltage controlled oscillator. (The ramp voltage is then reset to await the next start.) The samples are used in a feedback arrangement to correct the frequency of the voltage controlled oscillator. The phase locked loop is locked when the voltage of the ramp at the sample time coincides with the voltage required to keep the voltage controlled oscillator frequency synchronized with the reference oscillator frequency. Because of the negative feedback arrangement of the loop, the loop is self-correcting so that it maintains the time or phase of the voltage controlled oscillator signals or pulses synchronized with the reference oscillator signals or pulses.

Such a prior art sample and hold phase detector is versatile, in that the loop gain and hence the bandwidth and frequency switching speed can be controlled by adjusting the slope of the ramp voltage. This slope effectively sets the gain of the phase detector. If relatively high gain is needed, the ramp voltage can be made steep. However, such a steep ramp reaches the maximum supply voltage available, and then becomes constant. In many cases, a higher voltage is desired or needed to correct the frequency of the voltage controlled oscillator. This is an undesired condition that causes loss of synchronization, as will be explained. This limitation on the maximum voltage available results in a relatively long time to achieve synchronization where programmed inputs create a large difference between the phase of voltage controlled and reference oscillator signals or pulses. In some applications, such a relatively long time may not be acceptable or permissible.

SUMMARY OF THE INVENTION

Briefly, my invention provides a synchronizing circuit coupled to the output of the ramp generator in a phase locked loop circuit. My synchronizing circuit provides a blocking signal in response to the output of the ramp generator exceeding a selected magnitude, as it would for a large phase difference. This blocking signal is applied to the reference oscillator of the phase locked loop, and blocks the output of the reference oscillator. The effect of this blocked output is to delay the start of the next ramp voltage so that one or more phase comparisons between the reference oscillator and the voltage controlled oscillator are skipped or omitted. Such an omission enables the voltage controlled oscillator to be synchronized more rapidly to the reference oscillator than prior art arrangements where the reference oscillator starts each ramp voltage at its normal time. In another embodiment, the blocking signal may be applied to the controlled oscillator.

BRIEF DESCRIPTION OF THE DRAWING

The subject matter which I regard as my invention is particularly pointed out and distinctly claimed in the claims. The structure and operation of my invention, as well as advantages, may be better understood from the following description given in connection with the accompanying drawing, in which:

DESCRIPTION OF THE PREFERRED EMBODIMENT

In explaining my invention, I will first describe a frequency synthesizer as known in the prior art, and will then describe my improved circuit for such a frequency synthesizer.

PRIOR ART

Figure 1:
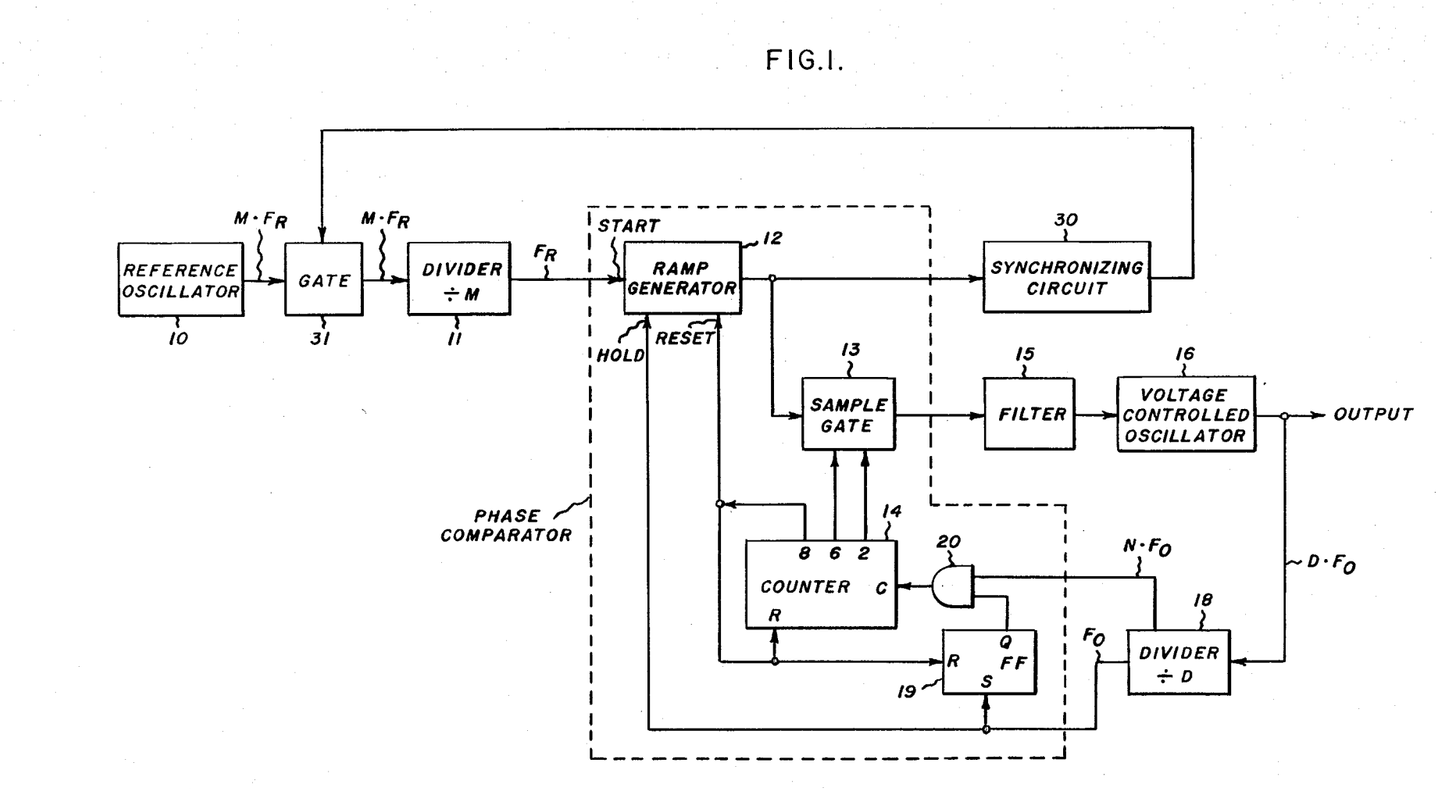
FIG. 1 shows a block diagram of a frequency synthesizer having a phase locked loop in accordance with my invention.

In FIG. 1, I show (as an example) a frequency synthesizer having a prior art phase locked loop, and further having a synchronizing circuit in accordance with my invention. As known in the prior art, such a frequency synthesizer includes a reference oscillator 10 which produces signals or pulses at a frequency $M \cdot F_R$. These reference oscillator signals are normally applied directly to a divider 11 which divides the frequency of the pulses to produce reference oscillator pulses $F_R$. These reference pulses $F_R$ are applied to a phase comparator (enclosed by dashed lines) at the start input of a ramp generator 12. In response to each of these pulses, the generator 12 produces a truncated ramp signal that rises linearly from some lower value (usually zero volt) to an upper value limited by available circuit voltages. The output of the ramp generator 12 is applied to a sample gate 13 which samples the voltage magnitude of the ramp signal at a time determined by a counter 14. The sampled (or phase comparator) output is applied to an integrator or lowpass filter 15, and the output of the filter 15 is applied to the control input of a voltage controlled oscillator 16. The output of the oscillator 16 is utilized in any way desired, such as in a radio or electronic equipment. The output of the oscillator 16 are signals or pulses whose frequency is $D \cdot F_O$. This output is applied to a divider 18 that divides by D to produce pulses at a frequency $F_O$. The divider 18 also divides the pulses of frequency $D \cdot F_O$ by another value to produce pulses of frequency $N \cdot F_O$. The pulses at the frequency $F_O$ are applied to the phase comparator at a hold input of the ramp generator 12, and are also applied at the set input S of a bistable flip-flop 19. The Q output of the flip-flop 19 is applied to one input of an AND gate 20. The pulses at the frequency $N \cdot F_O$ are applied to the other input of the AND gate 20. The output of the AND gate 20 is applied to the clock input C of the counter 14. The counter 14 may, for example, have outputs designated 2, 6 and 8 which respectively produce a pulse in response to every second, sixth and eighth clock pulse. The 8 output is applied to the reset input of the ramp generator 12, to the reset input R of the flip-flop 19, and also to the reset input R of the counter 14. The 2 and 6 outputs of the counter 14 are applied to the sample gate 13 to cause sampling to be taken between the second and sixth pulses applied to the clock input C of the counter 14.

Figure 2A:
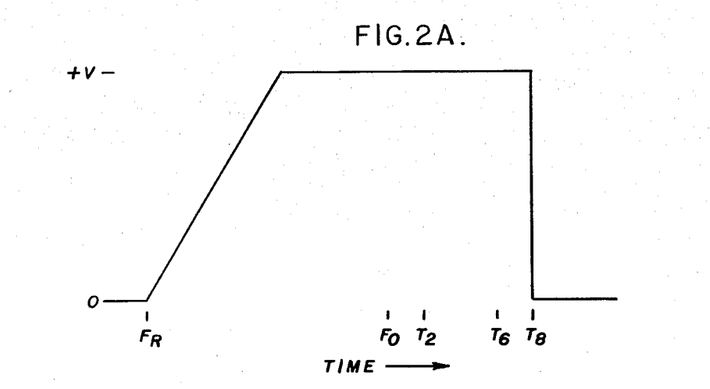
FIGS. 2A and 2B show waveforms for explaining the operation of FIG. 1.

FIG. 2A shows a typical truncated ramp produced by the ramp generator 12. As indicated at the time $F_R$ when a reference pulse $F_R$ is received, the ramp voltage starts and begins to rise from a low or zero value toward an upper value $+V$ (set by circuit conditions). If the ramp is not stopped or held, it will reach an upper magnitude, and then remain constant with time until reset. In FIG. 2A, I have assumed that the divider 18 produces a pulse $F_O$ (from the oscillator 16) at the indicated time $F_O$. This pulse $F_O$ applies a hold signal to the generator 12, but since the generator 12 is already producing its maximum output, the pulse $F_O$ has no effect. That is, the pulse $F_O$ does not stop the ramp, as the ramp has already stopped at the maximum voltage $+V$. The pulse $F_O$ also sets the flip-flop 19 so that its Q output permits the AND gate 20 to pass pulses at its other input, these pulses having a frequency $N \cdot F_O$. These pulses are applied to the clock input C of the counter 14 to cause it to count. After a delay to permit the circuit to stabilize and at the time T2, the 2 output of the counter 14 causes the sample gate 13 to begin sampling. This sampling continues until the time T6 when the 6 output of the counter 14 produces an output to close the sample gate 13. This sample is applied to the filter 14 and the oscillator 16 to control or correct the frequency of the oscillator 16. At the time T8 when the 8 output of the counter 14 produces a signal, a reset signal is applied to the ramp generator 12 to cause it to reset back to zero as indicated. This reset output also resets the counter 14 to reduce its count back to zero for the next sampling. As will be appreciated by persons skilled in the art, the time from the time $F_O$ through T8 is relatively short, in the order of one percent of the time period between the beginning of one ramp signal and the beginning of the next ramp signal.

Figure 2B:
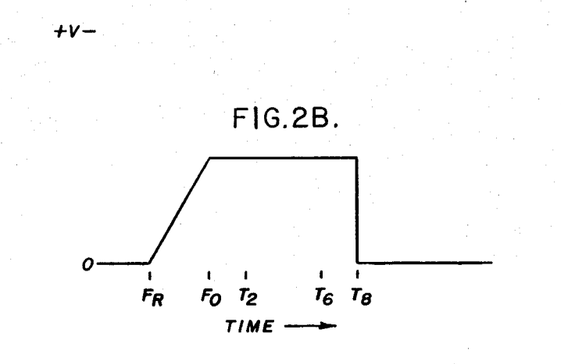

FIG. 2B shows a truncated ramp signal produced when an output pulse $F_O$ is relatively close in time or phase to a reference pulse $F_R$. As described in connection with FIG. 2A, the ramp is started at the time $F_R$. In FIG. 2B, it will be seen that at the time designated $F_O$, the divider 18 produces a signal which causes the ramp generator 12 to hold at a voltage which in this example is less than the maximum voltage $+V$. This signal $F_O$ also causes the counter 14 to produce the 2, 6 and 8 outputs which function in the same manner as described in connection with FIG. 2A.

Figure 3:
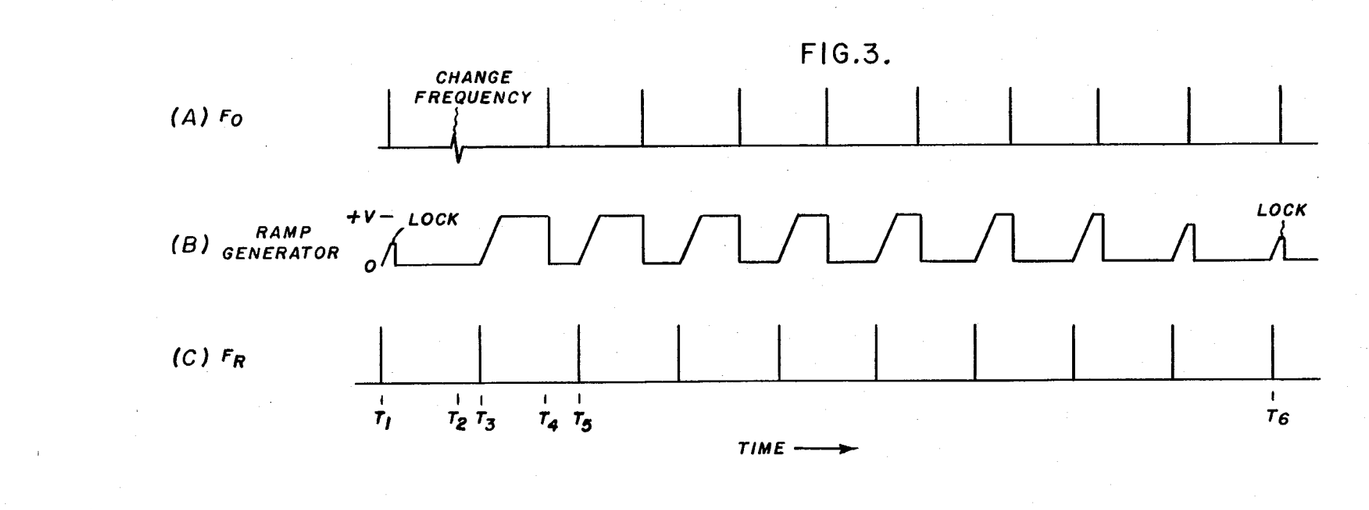
FIG. 3 shows waveforms illustrating the operation of FIG. 1 without my improved phase locked loop circuit.

FIG. 3 shows waveforms plotted along a common time axis for illustrating the operation of the circuit of FIG. 1 as described thus far and as known in the prior art. FIG. 3A shows the voltage controlled oscillator pulses $F_O$; FIG. 3B shows the ramp signal produced by the output of the ramp generator 12; and FIG. 3C shows the pulses $F_R$ produced by the reference oscillator 10. At the time T1, I have assumed that the phase locked loop circuit of FIG. 1 is in synchronization or lock, as indicated by the fact that the output pulse $F_O$ follows very closely in time the reference pulse $F_R$. The ramp generator 12 produces the ramp signal as shown in FIG. 2B which, during sampling, maintains the locked condition.

At the time T2, I have assumed that the output frequency of the circuit is to be changed, such a change being made, for example, by programming a different division number into the divider 18. The reference oscillator produces its output $F_R$ at its normal time T3, to cause the ramp generator 12 to start a ramp signal similar to that shown in FIG. 2A. Assuming the pulse $F_O$ does not occur at the proper time, the ramp signal reaches its maximum value $+V$. Then, at the time T4, the oscillator 16 produces an output pulse $F_O$ to provide a sample and resetting as indicated in connection with FIG. 2A. The next reference pulse $F_R$ is produced at the time T5, and another ramp signal is produced. This operation continues with time, and it will be noted that the time width of the ramp signals becomes progressively less, resulting from the fact that each produced ramp voltage causes the oscillator 16 to change the frequency of the output pulses $F_O$ to move into the proper phase relation with the reference pulses $F_R$. Finally, at the time T6, the frequency of the oscillator 16 has been corrected to conform or be in phase with the frequency of the reference oscillator 10, but, of course, at the new output frequency.

While the circuit of FIG. 1 as described thus far performs properly or correctly, it will be noted that where the synthesizer loses its locked condition, a considerable length of time is often required in order to correct the frequency of the oscillator 16 and produce the locked condition. Thus, with respect to FIG. 3, it will be seen that nine cycles or ramps are required to produce the locked condition, and such a relatively large number of cycles or ramps require an excessive or undesirable length of time. The circuit of my invention improves on this condition.

THE INVENTION

Figure 7:
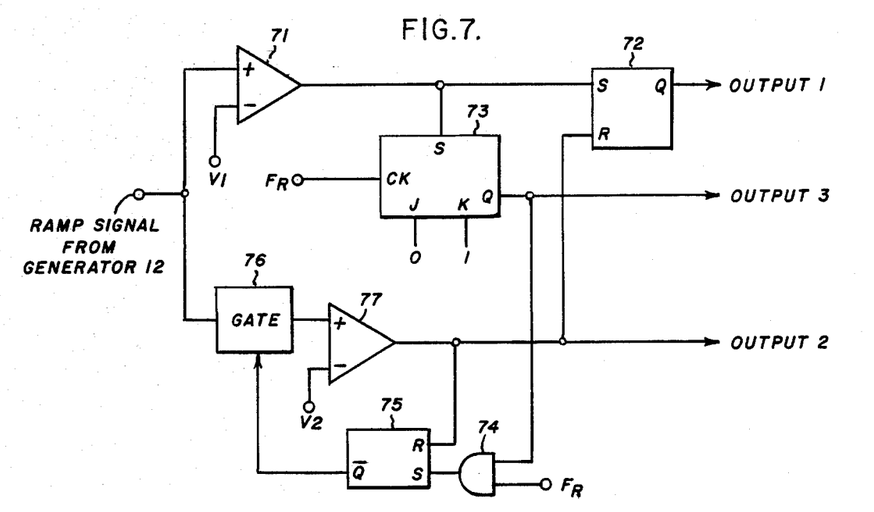

With respect to FIG. 7, my invention includes a synchronizing circuit 30 which is connected to the output of the ramp generator 12. As will be explained in connection with FIG. 5, my synchronizing circuit 30 produces a synchronizing or blocking signal in response to the magnitude of ramp signals which exceed a predetermined or selected value, and applies these signals to the control input of a gate 31. Normally, the gate 31 permits pulses at the frequency $M \cdot F_R$ from the oscillator 10 to be applied to the divider 11. However, during the time that the ramp signal exceeds its predetermined or selected magnitude, my synchronizing circuit 30 produces a blocking signal that prevents the pulses from the oscillator 10 from reaching the divider 11. As will be explained in connection with FIG. 4, this achieves synchronization or a locked condition more rapidly.

Figure 4:
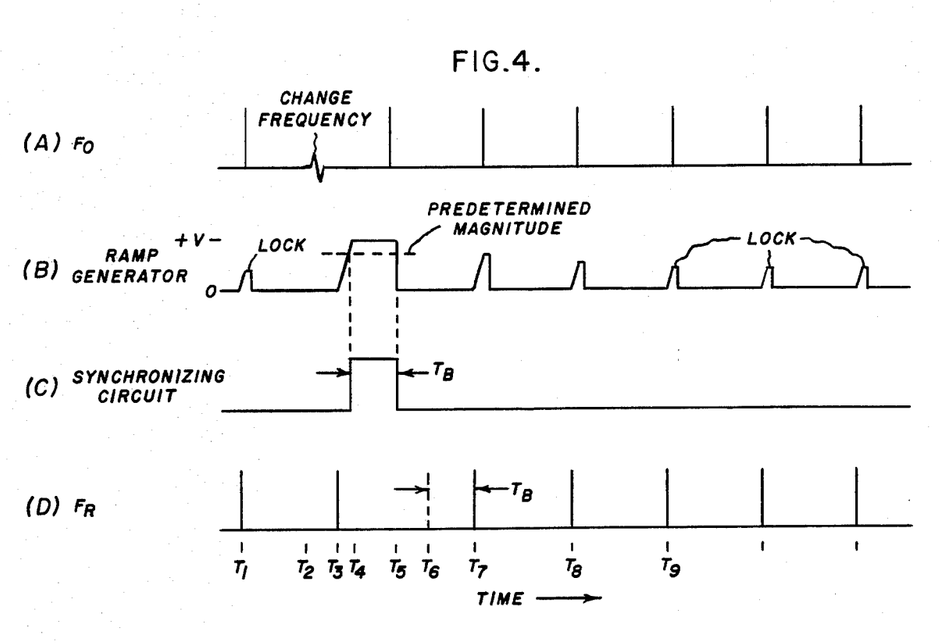
FIG. 4 shows waveforms illustrating the operation of FIG. 1 with my improved phase locked loop circuit.

The waveforms of FIG. 4 are plotted along a time axis. FIG. 4A shows the output pulses $F_O$; FIG. 4B shows the ramp generator signals; FIG. 4C shows the blocking signal produced by my synchronizing circuit 30; and FIG. 4D shows the reference oscillator pulses $F_R$. As in the case assumed for FIG. 4, I have assumed that the frequency synthesizer is producing the desired frequency and the circuit is locked as indicated at the time T1. At the time T2, a frequency change is programmed. At the time T3, the next reference pulse $F_R$ is produced to cause the ramp generator to produce a ramp signal. As indicated in FIG. 4B, this ramp signal reaches a predetermined magnitude at the time T4 to cause the synchronizing circuit 30 to produce a blocking signal as shown in FIG. 4C. Sampling of the ramp signal takes place as indicated in connection with FIG. 2A, and the ramp signal is reset at the time T5. This also causes the blocking signal to return to zero. However, between the times T4 and T5, indicated as the blocking time $T_B$, the gate 31 prevents or blocks pulses at the frequency $M \cdot F_R$ from reaching the divider 11. As a result, the next pulse $F_R$ which would have occurred at the time T6 (indicated by the dashed line in FIG. 4D) is delayed until the time T7. This delay between the times T6 and T7 is substantially the same as the time $T_B$ of the blocking signal. Hence, the next ramp signal does not begin until the time T7. A comparison of the pulses $F_O$ and $F_R$ in the vicinity of the time T7 shows how close they have become following the delay $T_B$. The next output pulse $F_O$ occurs shortly after the time T7, with the result that very little correction is needed, as indicated by the short duration of the ramp at the time T7. Continued correction is provided at the time T8 and a locked condition is achieved at the time T9. Thus, it will be seen that the time required to achieve a locked condition is reduced considerably by my synchronizing circuit 30 and gate 31. Using FIG. 4 as an example, only three ramp signals are required to achieve the locked condition, as opposed to the nine ramp signals required for the prior art circuit explained in connection with FIG. 3.

Persons skilled in the art will appreciate the fact that the time delay $T_B$ (set by the predetermined magnitude) and the ramp sampling time period ($F_O$ through T8) interact with each other, and should be selected so that synchronization is achieved as quickly as possible. For example, if the delay $T_B$ and the sampling period are too short, the ramp is permitted to approach its maximum; if the delay $T_B$ and the sampling period are too long, the next reference pulse $F_R$ will be delayed too long.

Figure 5:
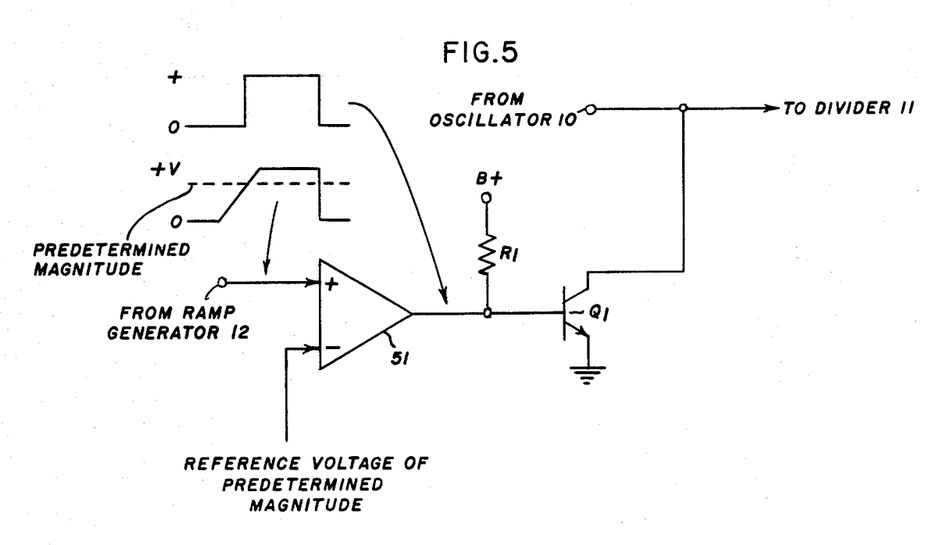
FIG. 5 shows a schematic diagram of one embodiment of a synchronizing circuit in accordance with my invention for the phase locked loop circuit of FIG. 1.

FIG. 5 shows a schematic diagram of one embodiment of a synchronizing circuit 30 and gate 31 in accordance with my invention. The synchronizing circuit may include an operational amplifier or comparator 51 havings its plus input connected to the output of the ramp generator 12 and its minus input connected to a predetermined reference voltage. The output of the comparator 51 is connected to the base of an NPN transistor Q1. A resistor R1 is connected between a voltage source B+ and the base. When the ramp signal is below the predetermined magnitude, the blocking signal is at zero, and the transistor Q1 is turned off. When the transistor Q1 is turned off, it permits signals from the oscillator 10 to be applied to the divider 11. When the ramp signal exceeds the predetermined magnitude, the comparator 51 produces the positive blocking signal at its output as indicated. This positive blocking signal turns the transistor Q1 on to pull its collector electrode to a relatively low value, so that signals from the oscillator 10 cannot reach the divider 11.

SUMMARY AND OTHER EMBODIMENTS

Figure 6:
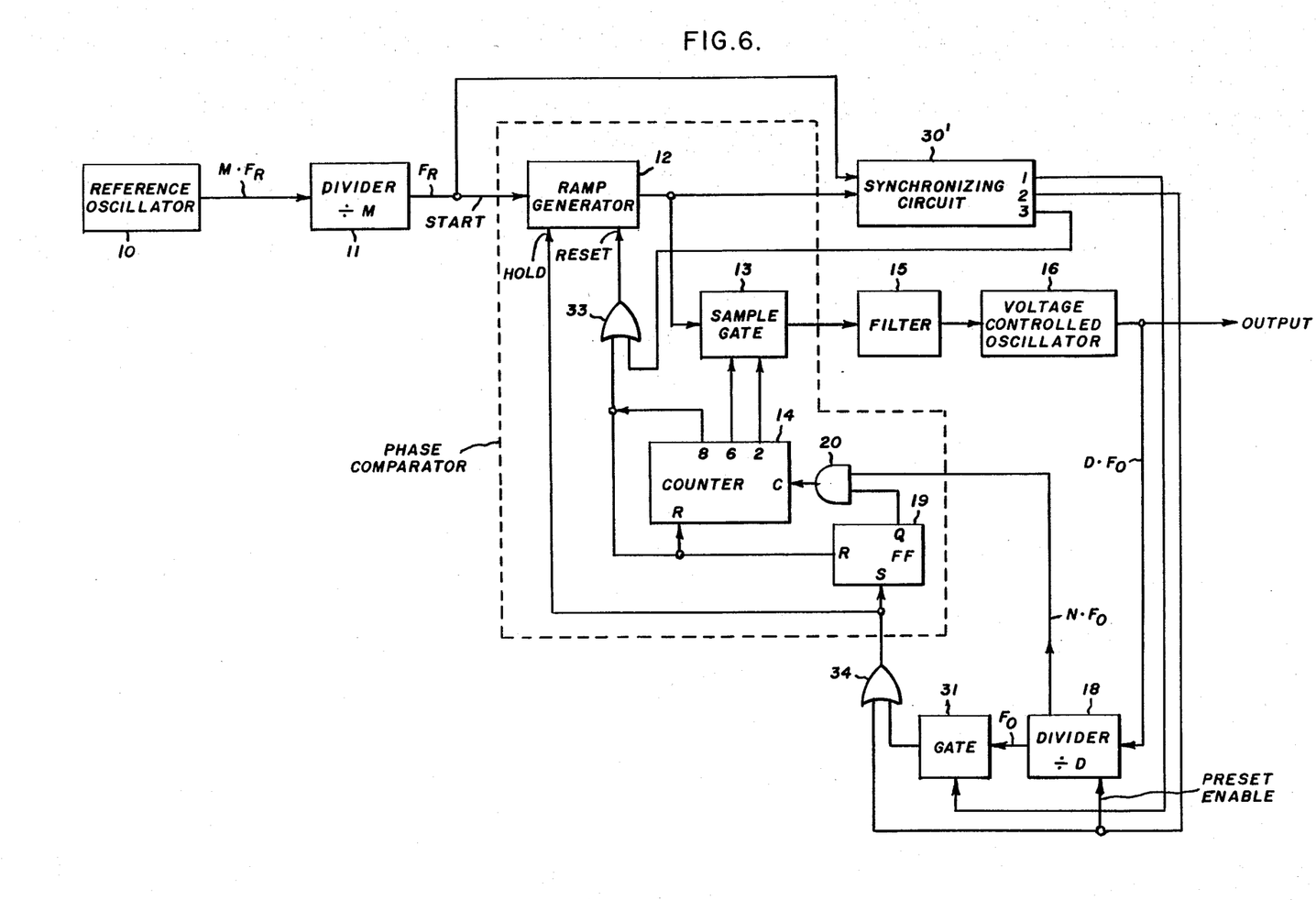
FIGS. 6 and 7 show a modification of FIG. 1 in accordance with my invention.

It will thus be seen that I have provided a new and improved synchronizing circuit for use with a phase locked loop to achieve synchronization of a controlled oscillator relatively quickly and reliably. Persons skilled in the art will appreciate the modifications that may be made to my synchronization circuit. As shown in FIG. 6, the output of a synchronizing circuit 30' may be used with the gate 31 at the output of the divider 18 to block output pulses $F_O$ in order to achieve quick lock or synchronization, instead of blocking the reference oscillator pulses $F_R$. The synchronizing circuit 30' of FIG. 6 produces a first output which, in response to a ramp voltage of a first predetermined magnitude V1 slightly less than the maximum voltage +V, blocks the gate 31 so that pulses at the rate $F_O$ from the divider 18 are not applied to the phase comparator. The first output is terminated in response to the next ramp voltage reaching a second predetermined magnitude V2 less than the first magnitude V1. The circuit 30' produces a second output pulse of short duration in response to the same next ramp voltage reaching the second predetermined magnitude V2. The second output is applied to a preset enable input of the divider 18 and also to one input of an OR gate 34. The circuit 30' produces a third output in response to the ramp voltage reaching the first predetermined magnitude V1. The third output is terminated in response to the beginning of the next ramp signal. The third output is applied to one input of an OR gate 33. The other input of the OR gate 33 is coupled to the 8 output of the counter 14. The output of the gate 33 is coupled to the reset input of the ramp generator 12. The other input of the OR gate 34 is coupled to the output of the gate 31. The output of the gate 34 is coupled to the hold input of the ramp generator 12 and to the set input S of the flip-flop 19. As shown in FIG. 7, the synchronizing circuit 30' uses a comparator 71 which is provided with the ramp signal and the first magnitude voltage V1. When the ramp signal exceeds the first magnitude V1, the output of the comparator 71 sets a flip-flop 72 which produces the first output. This same output sets a JK flip-flop 73 which then starts the third output. The flip-flop 73 is reset in response to the next pulse $F_R$ to end the third output. The output of the flip-flop 73 is applied to one input of an AND gate 74 along with the $F_R$ pulses. The output of the AND gate 74 sets a flip-flop 75 to permit a gate 76 to pass ramp signals. The output of the gate 76 is applied to a comparator 77 which produces an output when the ramp signal exceeds a second magnitude voltage V2 (lower than V1) to produce the second output. This also resets the flip-flop 72 to terminate the first output, and resets the flip-flop 75 so that the gate 76 blocks the ramp signal.

Figure 8:
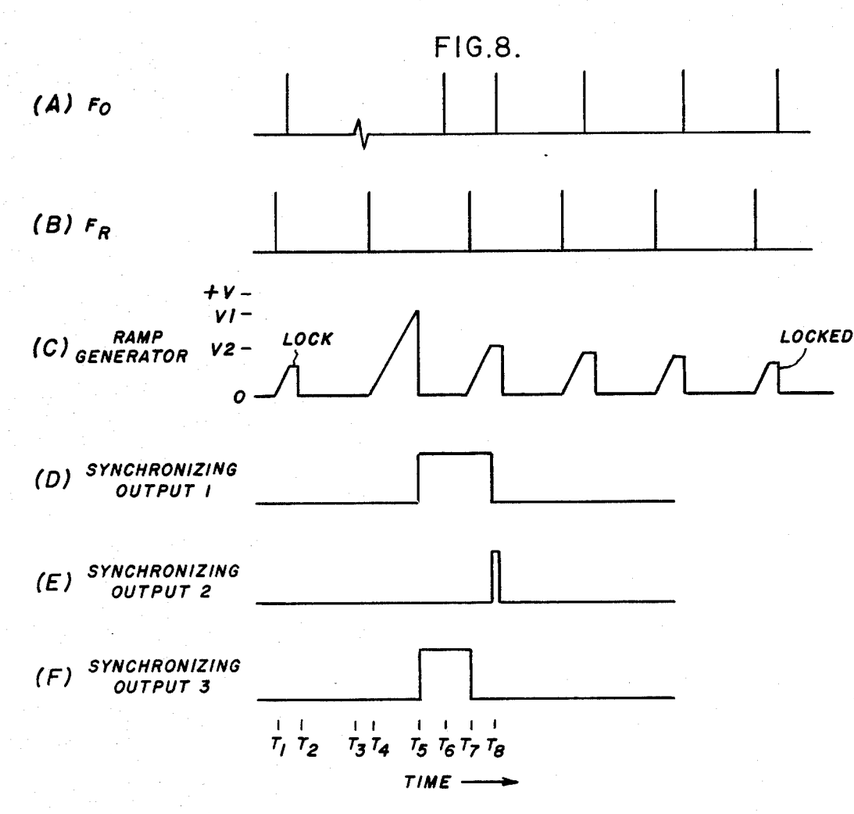
FIG. 8 shows waveform illustrating the operation of the modification of FIGS. 6 and 7.

The operation of FIGS. 6 and 7 is explained in the waveforms of FIG. 8, which are plotted along a common time axis. At the time T1, I assume that the circuit is in a locked condition, and the ramp is stopped at the voltage V2 by the proper occurrence of the pulse $F_O$ at the time T2. Then, I assume a new frequency is programmed at the time T3, followed by a reference pulse at the time T4. As shown in FIG. 8(C) the ramp signal begins, and rises until it reaches the first magnitude V1 at the time T5. The synchronizing circuit 30' produces its first output that causes the gate 31 to block the pulses at the rate $F_O$. Also at the time T5, the third output from the circuit 30' causes the OR gate 33 to pass a signal and reset the ramp generator 12 immediately, rather than waiting for the counter circuit 14 to go through its previously described operation. The next pulse $F_O$ at the time T6 does not cause any action because the gate 31 is blocked. The next pulse $F_R$ occurs at the time T7. This pulse terminates the third output so that the reset signal is removed from the ramp generator 12, and the ramp signal rises. This pulse $F_R$ also opens the gate 76 so that the synchronizing circuit 30' produces the second output when the ramp signal reaches the lower value V2 at the time T8. This second output terminates the first output so that the gate 31 passes pulses again. This second output is passed by the gate 34 to set the flip-flop 19 so that the gate 20 passes pulses $N \cdot F_O$, and to hold the ramp generator 12. The second output also presets the divider 18 to cause it to produce a pulse $F_O$ which as seen in FIG. 8(A) at the time T8 synchronizes the pulse $F_O$ with the pulse $F_R$. Thus, lock can then be achieved after perhaps 3 $F_R$ periods as shown in FIG. 8 versus 9 in FIG. 3 by virtue of the circuit blocking the pulses $F_O$ and forcing synchronization.

Different arrangements for the phase comparator may be provided, the exact arrangement and sampling times given being only one example. Also, the ramp generator may be started by the pulses $F_O$ from the oscillator 16 and the hold and reset signals supplied by the reference oscillator 10, instead of the arrangements shown. And, persons skilled in the art will appreciate the many types of synchronizing circuits that can be used in place of the arrangement shown in FIGS. 5 and 7. In addition to a frequency synthesizer, the phase locked loop may have other applications. Therefore, while my invention has been described with reference to a particular embodiment, it is to be understood that modifications may be made without departing from the spirit of the invention or from the scope of the claims.

What I claim as new and desire to secure by Letters Patent of the United States is:

1. In a phase locked loop circuit wherein the phase of a variable frequency repeating signal is compared with the phase of a reference frequency repeating signal, the improvement comprising:
   a. a generator for producing a ramp signal which Starts in response to each occurrence of a selected one of said repeating signals;
   b. a synchronizing circuit coupled to said generator for producing a blocking signal in response to one of said ramp signals that reach is a predetermined magnitude;
   c. and means responsive to said blocking signal for delaying a selected one of said repeating signals following said one ramp signal that reaches said predetermined magnitude.

2. The improvement of claim 1 wherein said ramp signal is started in response to said reference signal.

3. The improvement of claim 1 or claim 2 wherein said reference signal is delayed.

4. The improvement of claim 1 or claim 2 wherein said variable signal is delayed.

5. The improvement of claim 4 wherein said variable signal delay synchronizes the production of the next variable signal as a function of the time said one ramp signal reaches said predetermined magnitude.

6. The improvement of claim 4 wherein said comparison circuit synchronizes the production of the next variable signal with the ramp signal following said one ramp signal reaching a magnitude less than said predetermined magnitude.

7. An improved phase locked loop circuit comprising:
   a. a first input circuit for reference frequency signals;
   b. a second input circuit for controllable variable frequency signals;
   c. a generator having a start input, a reset input, and an output for producing a ramp signal at said output in response to signals at said start input;
   d. means coupling said first input circuit to said start input of said generator;
   e. a synchronizing circuit having an input coupled to said generator output for producing a blocking signal at an output in response to said ramp signal exceeding a predetermined magnitude;
   f. and means coupling said synchronizing circuit output to said first input circuit for blocking said reference frequency signals in response to said blocking signal.

8. The improved phase locked loop circuit of claim 7, and further comprising means coupled between said second input circuit and said reset input of said generator for resetting said ramp signal.

9. The improved phase locked loop circuit of claim 8, and further comprising sampling means coupled to said generator output for applying a control signal of selected time duration to said second input circuit.

10. The improved phase locked loop circuit of claim 7 or claim 8 or claim 9 wherein said ramp signal is truncated in form.

11. The improved phase locked loop circuit of claim 7, or claim 8, or claim 9 wherein said generator has a hold input, and means coupled between said second input circuit and said hold input for maintaining said ramp signal at the magnitude present upon the occurrence of said variable frequency signals.

12. An improved phase locked loop circuit comprising:
   a. a reference oscillator having an output;
   b. a voltage controlled oscillator having an input and an output;
   c. a phase comparison circuit comprising:
      1. a ramp generator having a start input and an output;
      2. first means for coupling said reference oscillator output to said start input of said ramp generator;
      3. a sample gate having an input coupled to said output of said ramp generator, and having an output;
      4. means coupling said sample gate output to said voltage controlled oscillator input;
   d. and a synchronizing circuit coupled between said output of said ramp generator and said coupling means for blocking the output of said reference oscillator in response to signals produced by said ramp generator that exceed a predetermined magnitude.

13. The improved phase locked loop circuit of claim 12 further comprising circuit means coupling said voltage controlled oscillator output and said ramp generator, and wherein said ramp generator produces a truncated ramp signal that starts in response to each reference oscillator signal at said start input and that ends in response to each voltage controlled oscillator signal applied through said circuit means to said ramp generator.

14. An improved phase locked loop circuit comprising:
   a. a first input circuit for reference frequency signals;

b. a second input circuit for controllable variable frequency signals;

c. a generator having a start input, a reset input, and an output for producing a ramp signal at said output in response to signals at said start input;

d. means coupling said first input circuit to said start input of said generator;

e. a synchronizing circuit having an input coupled to said generator output for producing a blocking signal at an output in response to said ramp signal exceeding a first predetermined magnitude;

f. and means coupling said synchronizing circuit output to said second input circuit for blocking said controllable frequency signals in response to said blocking signal.

15. The improved phase locked loop circuit of claim 14, and further comprising sampling means coupled between said second input circuit and said reset input of said generator for resetting said ramp signal.

16. The improved phase locked loop circuit of claim 15, and further comprising sampling means coupled to said generator output for applying a control signal of selected time duration to said second input circuit.

17. The improved phase locked loop circuit of claim 14 or claim 15 or claim 16 wherein said ramp signal is truncated in form.

18. The improved phase locked loop circuit of claim 14, or claim 15, or claim 16 wherein said generator has a hold input, and means coupled between said second input circuit and said hold input for maintaining said ramp signal at the magnitude present upon the occurrence of said variable frequency signals.

19. The improved phase locked loop circuit of claim 14, or claim 15, or claim 16 wherein said synchronizing circuit produces a synchronizing signal in response to said blocking signal and a subsequent ramp signal exceeding a second predetermined magnitude less than said first predetermined magnitude, and means coupling said synchronizing signal to said reset input of said ramp generator.

20. The improved phase locked loop circuit of claim 17 wherein said synchronizing circuit produces a synchronizing signal in response to said blocking signal and a subsequent ramp signal exceeding a second predetermined magnitude less than said first predetermined magnitude, and means coupled said synchronizing signal to said reset input of said ramp generator.

21. The improved phase locked loop circuit of claim 18 wherein said synchronizing circuit produces a synchronizing signal in response to said blocking signal and a subsequent ramp signal exceeding a second predetermined magnitude less than said first predetermined magnitude, and means coupling said synchronizing signal to said reset input of said ramp generator.

22. An improved method for synchronizing the phase of a voltage controlled oscillator with the phase of a reference oscillator connected in a phase locked loop having a ramp generator, comprising the steps of:

a. comparing the voltage produced by said ramp generator with a voltage of selected magnitude and producing a blocking signal in response to said ramp voltage exceeding said voltage of selected magnitude;

b. and blocking the output of one of said oscillators in response to and for the duration of said blocking signal.

23. The improved method of claim 22 wherein said one oscillator is said reference oscillator.

24. The improved method of claim 22 wherein said one oscillator is said voltage controlled oscillator.

25. An improved method for synchronizing the phase of pulses produced by a voltage controlled oscillator with the phase of pulses produced by a reference oscillator and divided, said oscillators being connected in a phase locked loop having a ramp generator, comprising the steps of:

a. comparing the voltage produced by said ramp generator with a voltage of selected magnitude and producing a blocking signal during the time said ramp generator voltage exceeds said voltage of selected magnitude;

b. and blocking the output of said reference oscillator pulses before division in response to and for the duration of said blocking signal, thereby delaying the start of said ramp voltage by said reference oscillator pulses.

* * * * *